United States Patent
Vashchenko et al.

(10) Patent No.: US 6,894,881 B1
(45) Date of Patent: May 17, 2005

(54) ESD PROTECTION METHODS AND DEVICES USING ADDITIONAL TERMINAL IN THE DIODE STRUCTURES

(75) Inventors: Vladislav Vashchenko, Fremont, CA (US); Ann Concannon, San Jose, CA (US); Peter J. Hopper, San Jose, CA (US)

(73) Assignee: National Semiconductor Corp, Santa Clara, CA (US)

(*) Notice: Subject to any disclaimer, the term of this patent is extended or adjusted under 35 U.S.C. 154(b) by 215 days.

(21) Appl. No.: 10/079,336

(22) Filed: Feb. 19, 2002

(51) Int. Cl.[7] ............................................... H02H 9/00
(52) U.S. Cl. ...................................................... 361/56
(58) Field of Search ................................ 361/56, 111

(56) References Cited

U.S. PATENT DOCUMENTS

| | | | | |
|---|---|---|---|---|
| 5,430,595 A | * | 7/1995 | Wagner et al. ................ | 361/56 |
| 5,565,790 A | * | 10/1996 | Lee .............................. | 326/30 |
| 5,854,504 A | * | 12/1998 | Consiglio ..................... | 257/358 |
| 5,859,758 A | * | 1/1999 | Kim ............................. | 361/111 |
| 6,072,219 A | * | 6/2000 | Ker et al. .................... | 257/355 |
| 6,097,235 A | * | 8/2000 | Hsu et al. .................... | 327/309 |
| 6,576,958 B2 | * | 6/2003 | Ker et al. .................... | 257/355 |

* cited by examiner

Primary Examiner—Brian Sircus
Assistant Examiner—Boris Benenson
(74) Attorney, Agent, or Firm—Jurgen Vollrath

(57) ABSTRACT

In an ESD protection circuit, diodes for shunting current through an ESD clamp include a third terminal in order to provide a dual current path through the diode structure and provide for a voltage drop to the input of the protected internal circuit. In another embodiment, where a bipolar junction transistor is used as an ESD clamp to shunt current to ground between an I/O pad and an input to a protected internal circuit, a lower voltage is provided to the internal circuit by providing a voltage drop across an internal resistive element of the bipolar junction transistor. This is achieved by making use of two base terminals, one connected to the I/O pad, and the other connected to the input of the internal circuit and spaced from the first contact by the base polysilicon region of the bipolar junction transistor.

8 Claims, 5 Drawing Sheets

ESD PROTECTION METHODS AND DEVICES USING ADDITIONAL TERMINAL IN THE DIODE STRUCTURES

FIELD OF THE INVENTION

The invention relates to ESD protection and more particularly to improved diode elements used in ESD protection circuits.

BACKGROUND OF THE INVENTION

In order to avoid thin gate oxide damage to integrated circuits as a result of electrostatic discharge (ESD), special ESD protection circuits have been developed to shunt high ESD current pulses to ground. These, however, invariably take up a considerable amount of extra space on an integrated circuit to chip. It is therefore desirable to keep the number of such shunt circuits or clamps to a minimum. However, especially in the case of digital circuits, it is common to find extremely complex circuits with numerous inputs and outputs. Each of these pads presents a potential source for damage to the circuit and therefore needs to be coupled to an ESD clamp. As a space saving measure, instead of providing a separate clamp for each I/O pad, the I/O pads are, instead, coupled by means of diodes to the power rails, which, in turn, are provided with protective clamps. In this way, numerous inputs and outputs can be protected by a single ESD clamp. In a typical circuit, low resistive power supply rails (VDD, VSS) or separate rail buses are provided, and each I/O pin or pad is connected to these rails using p-well and n-well diodes as shown in the prior art circuit of FIG. 1. FIG. 1 shows a pad 10 connected by means of a p-well diode 12 to a VDD bus and by means of a n-well diode 14 to a VSS bus. The protected circuit, which in this case takes the form of an inverter 16, is protected by an ESD clamp 18 connected between the VDD and VSS buses. In the absence of the diodes 12, 14, the ESD clamp 18 would only protect the circuit 16 against ESD pulses on the power rails VDD or VSS. However, an ESD pulse on the pad 10 would be fed directly to the circuit 16, exposing the circuit to thin oxide damage. Through the addition of the diodes 12, 14 a positive ESD pulse to the pad 10 is channeled via the diode 12 through the ESD clamp 18. Similarly, a negative ESD pulse to the pad 10 is channeled through the ESD clamp 18 and the diode 14 to effectively protect the circuit 16 against all ESD current pulses. A typical p-well diode is illustrated in FIG. 2 and includes a p-well 20 formed in a p-substrate 22. A n+ region 24 and a p+ region 26 are formed in the p-well 20 and are separated by a shallow trench isolation region 27. FIG. 2 also shows the cathode contact 28 connected to the n+ region 24 and the anode contact 29 connected to the p+ region 26. FIG. 3, in turn, shows the structure of a n-well diode which comprises a n-well 30 formed in a p-substrate 32, with a p+ region 34 and a n+ region 36 formed in the n-well 30 and separated by a shallow trench isolation region 37. A cathode contact 38 is provided for the n+ region 36, and an anode contact 39 is provided for the p+region 34.

According to TLP measurements, the diode characteristics provide for reliable ESD operation during ESD current pulses of 4–6 V. This is also referred to as the VT2 value which is associated with a corresponding IT2 increase. However, when a diode operates in this dynamic range of power operation, it creates a danger of thin oxide damage to the internal I/O driver (such as the inverter in FIG. 1) and can occur even before the diode reaches its IVT2 burn out point. This problem is already starting to become apparent with current 0.18 mm/3.3V technology, but will become even more so in future as gate dimensions continue to be reduced and the operating voltage and corresponding gate oxide thickness and resultant breakdown voltage become ever smaller.

The problem is further exacerbated by the fact that the circuit interconnects provide a voltage drop which, for a 1 Ohm resistance provides for an extra 1 V drop for each Amp of current in the current pulse. While the diode effectively sees a lower voltage due to the voltage drop across the interconnect, the full voltage appears across the internal circuit being protected, namely the I/O driver. Referring to FIG. 1, the interconnects 13, 15 present the diodes 12, 14 with a lower voltage due to the voltage drop across the interconnects 13, 15. On the other hand, the internal circuit 16, which is connected in parallel and has its input connected to an external node 19, experiences the full ESD voltage seen by the diode 12 or 14, is well as the additional voltage drop across the interconnect 13 or 15.

A further factor to be considered is the internal capacitance of the ESD circuits when operating at high frequencies in the RF range. Also, limitations are placed on the choice of power diodes for the diodes themselves since the diodes have to be created using existing process technology, meaning that only junctions and regions from supported devices of existing technology are typically used to create the power diodes.

The present invention seeks to address the issue of providing a more efficient diode solution that takes into account the voltage limitations of the internal circuit to be protected, the need to keep the sizes of such diodes to a minimum, and preferably provide a solution that makes use of supported devices and avoids substantial new process steps.

SUMMARY OF THE INVENTION

The present invention provides a method and circuit for reducing the input voltage to a protected circuit that is protected through a diode by an ESD protection circuit. In particular, the present invention achieves this by providing at least one additional current path within the diode structure and providing a voltage drop across one current path to provide a reduced voltage output that serves as the input to the protected circuit.

In one embodiment, a dual circuit path is achieved through the use of an additional terminal to the diode. In the case of a n-well diode, two cathodes are used in the circuit, while in a p-well diode, two anodes are used. The voltage drop is provided across an internal resistive structure of the diode, which in one embodiment, is provided by the well of the diode.

In another embodiment, a diode-like structure is provided by making use of a bipolar junction transistor (BJT) making use of two base contacts separated by a base polysilicon region that acts as a resistor element to provide the necessary voltage drop.

According to the invention there is provided a diode circuit having three contacts, wherein one contact is connected to a region of the first polarity and the other two contacts are connected to regions of the opposite polarity and are separated by a well region or other partially resistive region. More than two contacts connected to regions of the opposite polarity may be provided and separated by a well region or other partially resistive region. In the case of a p-well diode, the diode is provided with a cathode contact connected to a n+ region and two or more anode contacts connected to p+ regions. In the case of a n-well diode, an anode contact is connected to a p+ region and two or more cathode contacts are connected to n+ regions.

Further, according to the invention, there is provided a diode circuit providing a first current path between an anode and a cathode, and a second current path between a second anode or cathode and the first anode or cathode, respectively.

Further, according to the invention, there is provided a diode with a first contact connected to a region of a first polarity and at least two second contacts connected to regions of the opposite polarity, wherein one of the at least two contacts connected to the regions of opposite polarity defines an input to the diode structure, while the at least one other contact connected to the region of opposite polarity defines an output of the diode structure. Preferably, the diode structure is a three terminal device with one cathode and two anodes or one anode and two cathodes. Typically the two cathodes or two anodes in the diode structure are separated by a partially resistive element such as a well region.

Still further, according to the invention, there is provided a method of reducing the voltage to which a protected circuit is exposed by a diode under ESD current pulses, comprising using an anode or a cathode as an input to the diode structure, and using a second electrode of the same type as an output from the structure, wherein the second electrode is separated from the first electrode by a resistive element such as a well region to provide a voltage drop under ESD current pulse conditions. The two electrodes may either be two cathode contacts connected to two n+ regions and separated by a n-well, or may be two anode contacts connected to two p+ regions and separated by a p-well.

Still further, according to the invention, there is provided an ESD protection circuit for an internal circuit that is provided with an I/O pad, comprising an ESD clamp between power rails for the internal circuit, a first diode structure between the pad and one power rail, and a second diode structure between a second power rail and the pad, wherein each of the diode structures has an input terminal connected to the pad, and a separate output terminal connected to the internal circuit. The input terminal and output terminal are typically separated by an internal resistive element of the diode structure to provide a voltage drop between the input terminal and the output terminal. In one embodiment, the one diode structure is a p-well diode with a first anode terminal connected to the pad and a second anode terminal connected to an input to the internal circuit and separated from the first anode terminal by a p-well, wherein a cathode terminal is connected to a power rail. The other diode structure in this embodiment is a n-well diode in which one cathode terminal is connected to the pad and a second cathode terminal is connected to the input to the internal circuit and spaced from the first cathode by a n-well, wherein an anode terminal is connected to the other power rail.

Still further, according to the invention, there is provided an ESD protection circuit for protecting an input to an internal circuit from ESD current pulses to an I/O pad, which comprises a bipolar junction transistor structure for shunting current to ground, wherein the bipolar junction transistor structure includes a first base contact connected to the I/O pad and a second base contact connected to the input of the internal circuit, wherein the two base contacts are separated by a base polysilicon region defining a resistive element between the two base contacts.

Still further, according to the invention, there is provided a method of protecting an input to an internal circuit against ESD current pulses to an I/O pad, comprising shunting the current pulse to ground by means of a bipolar junction transistor structure wherein the bipolar junction transistor structure includes a first base contact and a second base contact, and wherein the method includes connecting the first base contact to the I/O pad and the second base contact to the input of the internal circuit, and causing current flow to the first base contact to experience a voltage drop to the second base contact. The voltage drop between the first and second base contacts is achieved by making use of current flow through at least one resistive element of the bipolar junction transistor structure, which typically will include the base polysilicon region to which both base contacts are connected.

DESCRIPTION OF THE DRAWINGS

Figure 1:
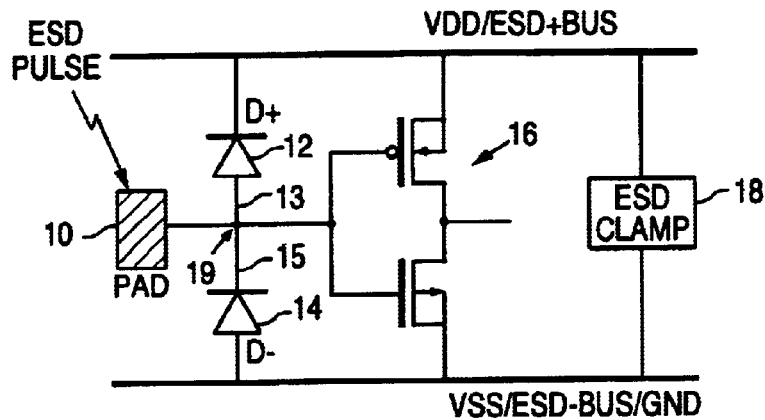
FIG. 1 is a schematic circuit diagram of an ESD protection circuit of the prior art.
Figure 2:
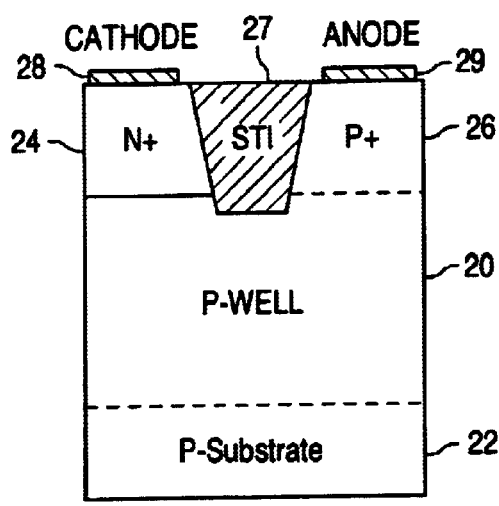
FIG. 2 is a sectional representation of the structure of a p-well diode.
Figure 3:
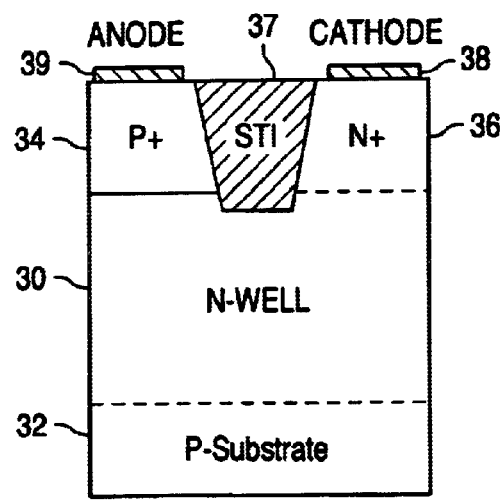
FIG. 3 is a sectional representation of the structure of a n-well diode.
Figure 4:
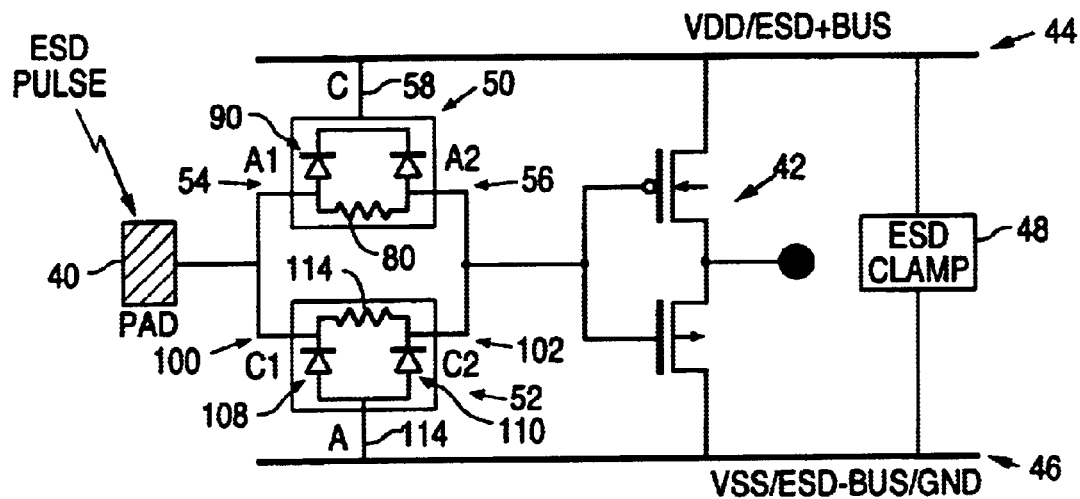
FIG. 4 is a schematic circuit diagram of one embodiment of an ESD protection circuit in accordance with the invention.
Figure 5:
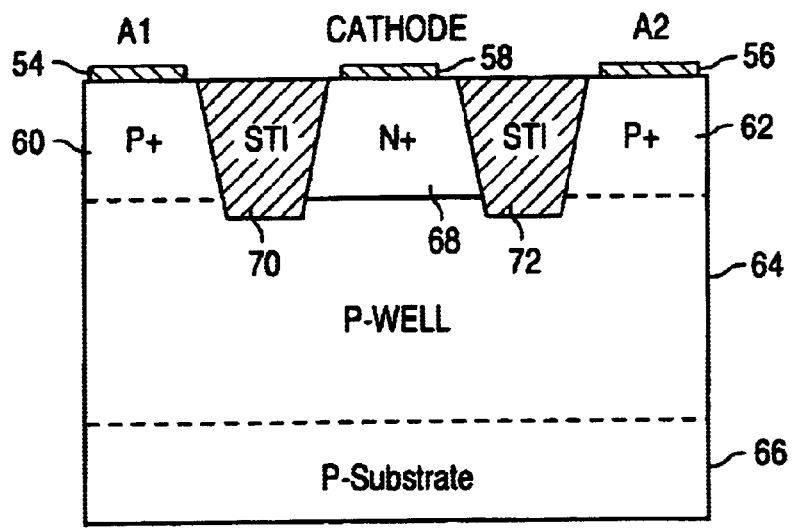
FIG. 5 is a sectional representation of the structure of a p-well diode of the invention.

An embodiment of the invention is illustrated in FIG. 4 which shows a pad 40 connected to an internal circuit 42 that is to be protected, in this case, an inverter. The internal circuit 42 is connected to a positive power rail 44 and a negative power rail or ground 46. An ESD clamp 48 protects the internal circuitry 42 against ESD current pulses directly if the pulses are applied to one of the power rails. It also protects against positive and negative ESD current pulses to the pad 40, through the use of two diode structures 50, 52 which channel the current through the ESD clamp 48. The diode structure 50 comprises a p-well diode structure in accordance with the invention as will be discussed in great detail with respect to FIG. 5. Diode structure 52, in turn is a n-well diode structure which will be discussed in greater detail below with reference to FIG. 6. The p-well diode structure 50 includes a first anode contact 54 connected to the pad 40 and a second anode contact 56 connected to the internal circuit 42. The cathode contact 58, in turn, is connected to the VDD bus or positive power rail 44. For ease of understanding similar reference numerals are used for like structures in the p-well cross section of the diode structure shown in FIG. 5. As can be seen in FIG. 5, the first anode contact 54 is connected to a p+ anode region 60. Similarly, the second contact 56 is connected to a p+ anode region 62. The p+ region 60 and p+ region 62 are separated by a p-well 64 formed in a p-substrate 66. The cathode contact 58 is shown connected to a n+ region 68. The two p+ anode regions 60, 62 and the n+ cathode region 68 are separated from each other by shallow trench isolation regions 70, 72. Thus, it is clear that while the diode structure in FIG. 4 depicts the p-well diode structure 50 as comprising two diodes separated by a resistor 80, this serves merely as a schematic representation of the dual diode created by the two anode regions 60, 62 with the common cathode 68. The resistor 80 consists substantially of the resistive pathway created by the p-well 64 between the two anode regions 60, 62.

Referring again to FIG. 4, it is clear that a positive current pulse applied to pad 40 will pass from the anode contact 54 to the cathode contact 58 and to the other anode contact 56. Thus current passes through a diode structure depicted by reference numeral 90 and comprising the anode cathode pair 60, 68, in FIG. 5, and through the p-well 64 depicted substantially by the resistive element 80 to the anode contact 56.

Figure 6:
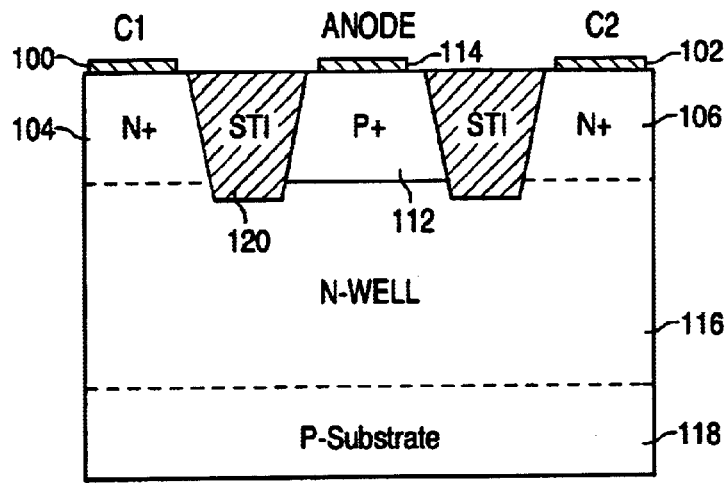
FIG. 6 is a sectional representation of the structure of a n-well diode of the invention.

The n-well diode structure 52, in turn, includes a first cathode contact 100 connected to the I/O pad 40, and a second cathode contact 102 connected to the internal circuit 42. The two cathode contacts 100, 102 are connected to n+ cathode regions 104, 106 as illustrated in FIG. 6 and which define two diode structures 108, 110 (FIG. 4) with a common p+ anode region 112 shown in FIG. 6. The anode region 112 is contacted by an anode contact 114 which, in FIG. 4 is connected to PSS or the ground bus 46. The resistance 114 illustrated in FIG. 4 corresponds substantially to the resistive pathway presented by the n-well 116 formed in the p-substrate 118 as shown in FIG. 6.

During a negative ESD current pulse on pad 40, current is channeled through the ESD clamp 48 and the n-well diode structure 52, following a dual path through the diode stricture 52. Current passes from the anode contact 114 through the diode structure 108 comprising the anode region 112 and cathode region 104 which is separated by the shallow trench isolation region 120. The current then passes to the cathode contact 100 and from there to the pad 40. Current also flows from the cathode contact 102 through the n-well 116 depicted substantially by the resistive element 114 in FIG. 4, to the cathode contact 100. Thus, in both scenarios, whether there is a positive or a negative current pulse, a voltage drop is experienced through a well region which results in a lower voltage being presented to the internal circuit 42.

In effect, in both diode structures 50, 52, one part of the structure is used for power ESD operation and constitutes the diode structure connected to the I/O pad 40, while the other one part provides a lower voltage to the internal circuit 42 by providing a current path through and internal resistance provided by the well region 64, 116.

Figure 7:
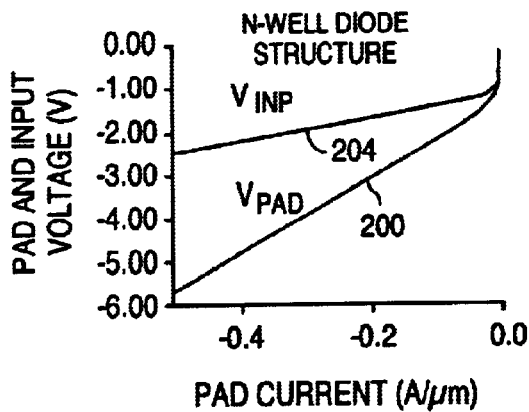
FIG. 7 shows V-I curves for voltage levels at the pad and at the input to the internal circuit for a n-well diode structure of the invention.
Figure 8:
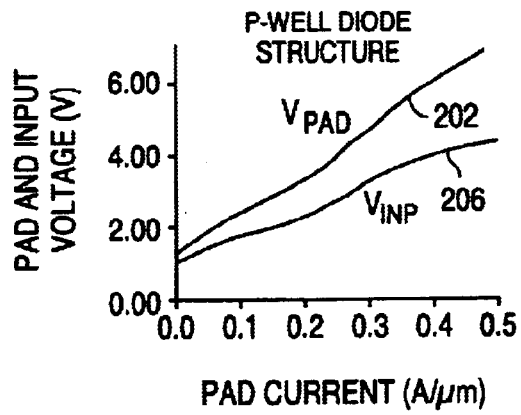
FIG. 8 are V-I curves for the voltage at the pad and at the input to the internal circuit for a p-well diode structure of the invention.

While, under normal operation, the internal well saturation resistor 80, 114 provided by the well region 64, 116, respectively, adds additional resistance to the input of the internal circuit 42, the resultant voltage drop under normal operation is negligible for the high input impedance of CMOS I/O circuits. However, this distribution of the electrical potential inside the well of the diode structure has a marked effect during high current ESD events as is confirmed by TCAD simulations. As illustrated in FIGS. 7 and 8, as the current increases, voltage at the pad contact 100, 54 (FIG. 4) experiences a substantial voltage increase as shown by the curves 200, 202 in FIGS. 7 and 8, respectively. In contrast, the voltage at the contacts to the internal circuit 102, 56 show a markedly lower voltage level, as depicted by curves 204, 206 in FIGS. 7 and 8, respectively. Thus, the diode protection circuit of the invention presents the internal circuit with a significantly lower input voltage under ESD current pulses as shown by the V-I curves of FIGS. 7 and 8.

Figure 9:
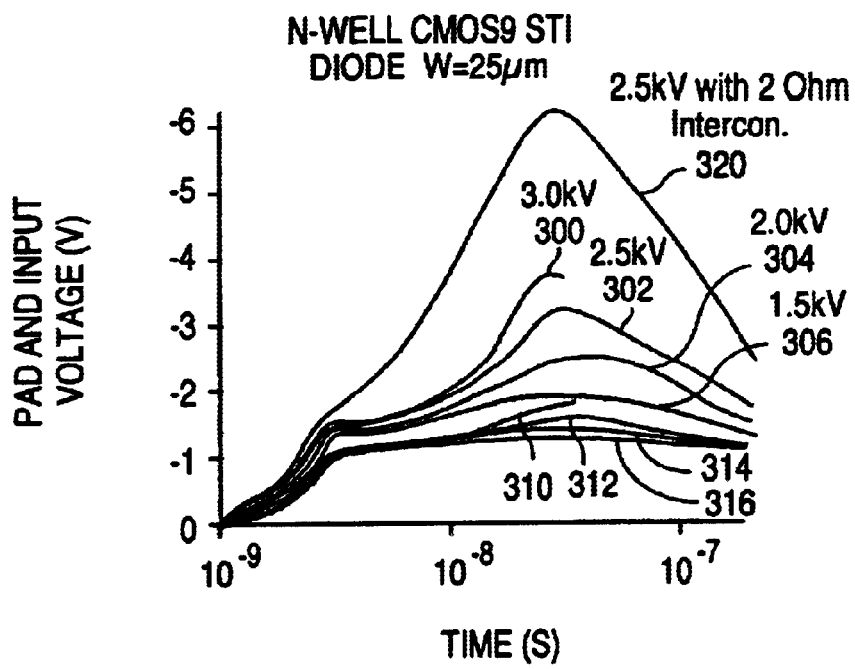
FIG. 9 shows various voltage curves over time for voltages at the pad and at the input to an internal circuit in accordance with the invention for a n-well diode structure.

FIG. 9, in turn, shows voltage curves over time for the n-well diode structure 52 for various ESD pulses, and shows the corresponding voltage curves over time at the cathode terminal presented to the internal circuit. Curves 300, 302, 304, 306 show the voltage curves at the cathode terminal 100 for pulses of 3.0 kV, 2.5 kV, 2 kV, and 1.5 kV, respectively. The corresponding curves at the terminal 102 presented to the internal circuit 42, are given by reference numerals 310, 312, 314, and 316, respectively. An additional curve 320 shows the effect of a 2 Ohm interconnect resistance at the cathode terminal 100 for a pulse of 2.5 kV. The corresponding curve for the voltage at the terminal 102 for a 2 Ohm interconnect resistance coincides substantially with the curve 312 and is therefore not visible on FIG. 9. Thus, at the terminal 102, the voltage remains essentially unchanged by the interconnect resistance for a 2.5 kV pulse. This confirms that in the circuit of the invention, the internal resistance effect is essentially eliminated at the terminal 102.

Figure 10:
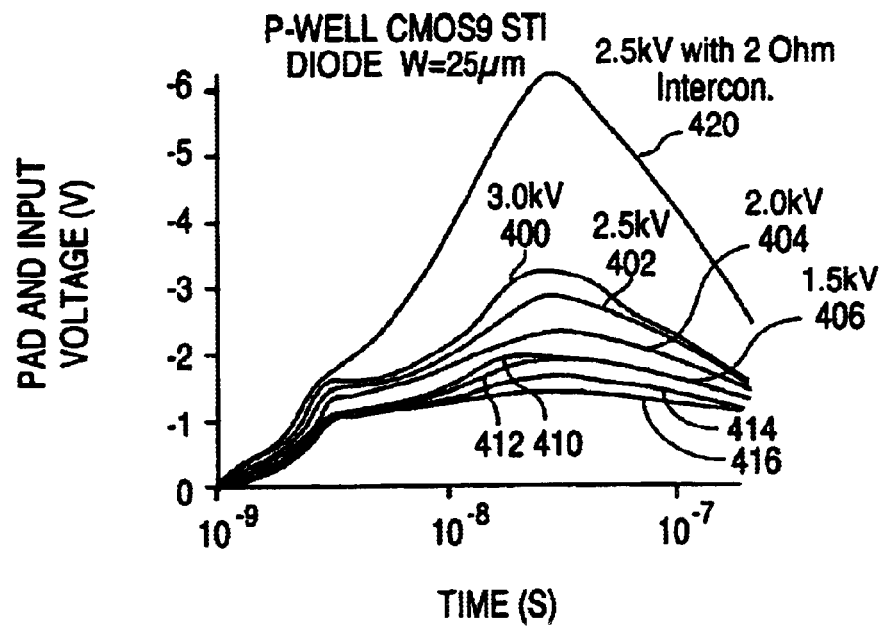
FIG. 10 are voltage curves over time for the pad voltage and input voltage to the internal circuit for a n-well diode structure of the invention.

Similar results are shown in FIG. 10 for a p-well structure such as the one described with reference to FIGS. 4 and 5. The voltage curves for a 3.0 kV, 2.5 kV, 2 kV, 1.5 kV pulse at the pad contact 54 is shown by the curves 400, 402, 404, 406, respectively, and for the anode contact 56 connected to the internal circuit, by the curves 400, 412, 414, 416, respectively. The effect of a 2 Ohm interconnect resistance for a 2.5 kV pulse is shown for the pad contact 54, by the curve 420. Again, the corresponding curve for the voltage at the terminal 56 for a 2 Ohm interconnect resistance coincides substantially with the curve 412 and is therefore not visible on FIG. 10. Thus, it is again evident that at the terminal connected to the internal circuit, the voltage remains essentially unchanged by the interconnect resistance.

Figure 11:
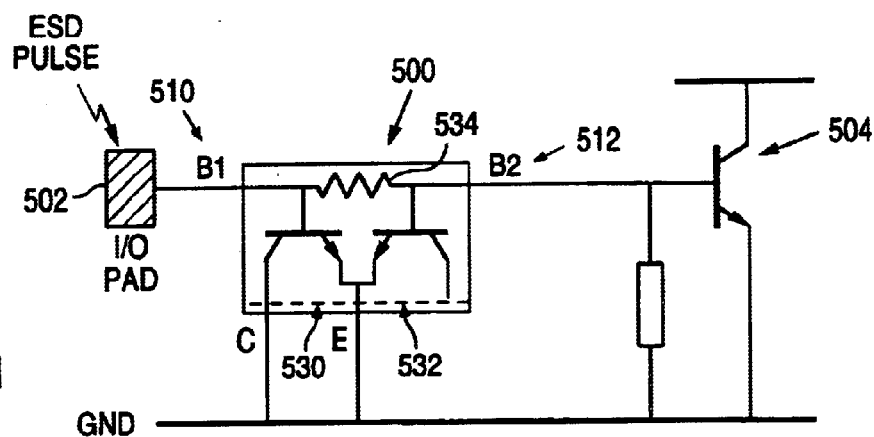
FIG. 11 is a schematic circuit diagram of mother embodiment of an ESD protection circuit of the invention.
Figure 12:
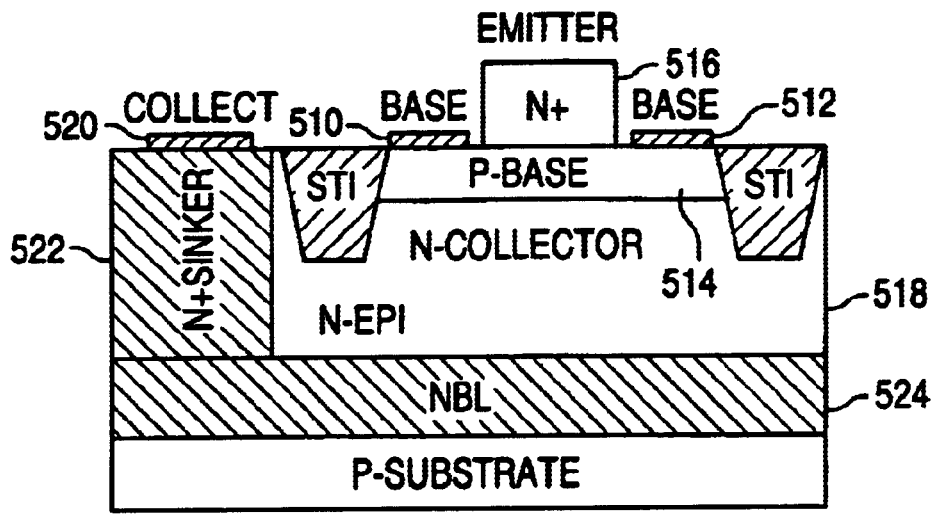
FIG. 12 is a sectional representation of a bipolar junction transistor structure used in the embodiment of FIG. 11.

Another application of the internal resistance feature in reducing the voltage presented to an internal circuit under ESD conditions is shown in FIG. 11. FIG. 11 shows the use of a bipolar junction transistor (BJT) used as an ESD clamp for shunting current to ground. In this case, a NPN transistor structure 500 is connected between an I/O pad 502 and an internal circuit that is to be protected 504, which in this case is an NPN transistor. The NPN transistor structure 500 is best explained with reference to a representation of the internal structure as shown in FIG. 12. Use is made of two base contacts 510, 512. Contacts 510, 512 contact a p-base region 514. The transistor structure 500 further includes a n+ emitter 516 and a n-collector 518. The 518 is contacted by a collector contact 520 through a N-sinker region 522 and a n-buried layer (NBL) 524. The use of the two base contacts 510, 512 separated by the p-base region 514 in effect forms two NPN transistors, depicted in FIG. 11 by reference numerals 530, 532. The p-base region 514 acts as an internal resistor stricture which is depicted in FIG. 11 by the resistor 534. Thus, by connecting the one base contact 510 to the I/O pad, and the other base contact 512 to the circuit 504. The resistance of the p-base 514 is used to reduce the voltage presented to the circuit 504 that is to be protected. Thus, again, a dual current path is established wherein the one current path makes use of an internal resistance to reduce the voltage presented to the circuit that is to be protected.

Figure 13:
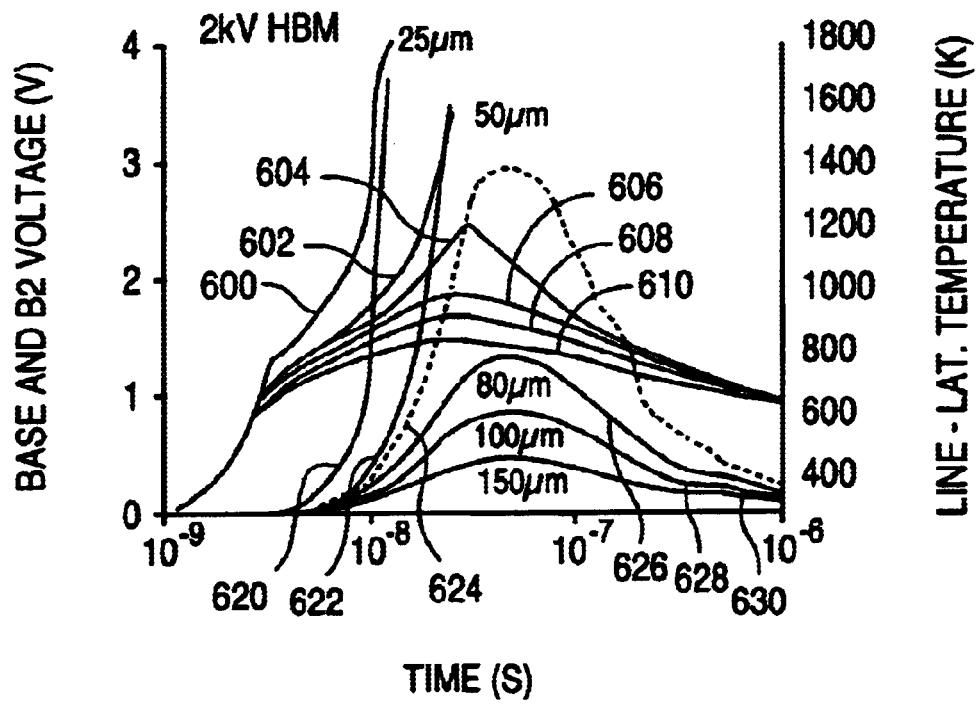
FIG. 13 shows voltage curves over time for the two base contacts for various width structures of transistors according to FIG. 12.

TCAD simulation results illustrated in FIG. 13 show the voltage curves over time for various width devices adopting an embodiment as illustrated in FIG. 11. Curves 600, 602, 604, 606, 608 and 610 show a voltage curve at the pad contact 510 for structure widths of 25 $\mu$m, 50 $\mu$m, 60 pun, 80 $\mu$m, 100 $\mu$m, and 150 $\mu$m, respectively. In contrast, the corresponding voltage curves at the base contact 512 are shown to be significantly lower and are given by the curves 620, 622, 624, 626, 628, and 630, respectively. For example, the voltage curve at the base contact 512 presented to the circuit 504 for an 80 $\mu$m device, as given by the curve 626, is lower even than the voltage curve for the pad contact 510 for a 150 $\mu$m device. It is thus clear that the invention provides a significant size saving which provides for yet another feature of the invention. By making use of the internal voltage drops discussed above, the circuits of the present invention allow smaller ESD protection structures to be created which, in turn, lend themselves to high frequency applications such as RF applications where the reduced capcitances of the smaller devices of the invention are particularly beneficial. Also, through the use of a separate contact connected to the circuit that it is to be protected, the interconnect resistance effects are effectively eliminated.

Although the present invention has been described with reference to particular embodiments, it will be appreciated that the use of internal resistance structures to reduce the voltage to the internal circuits under ESD stresses can be implemented in other ways without detracting from the scope of the invention.

What is claimed is:

1. An ESD protection circuit for an internal circuit that includes an I/O contact, comprising
    an ESD clamp between power rails for the internal circuit,
    a first three pin diode structure having two anodes and a cathode, connected between the I/O contact and one power rail, wherein the two anodes include an input anode connected to the I/O contact, and a separate output anode connected to the internal circuit, and
    a second three pin diode structure having two cathodes and an anode, connected between a second power rail and the I/O contact, wherein the two cathodes include an input cathode connected to the I/O contact, and a separate output cathode connected to the internal circuit.

2. An ESD protection circuit of claim 1, wherein the two anodes of the first diode structure are separated by an internal resistive element of the first three pin diode structure, and the two cathodes of the second diode structure are separated by an internal resistive element of the second three pin diode structure.

3. An ESD protection circuit of claim 1, wherein the first three pin diode structure is a p-well diode with the first anode connected to the I/O contact and the second anode is connected to an input to the internal circuit and separated from the first anode by a p-well, and the cathode terminal of said first three pin diode structure is connected to a power rail, and wherein the second three pin diode structure is a n-well diode in which the first cathode is connected to the I/O contact and the second cathode is connected to the input to the internal circuit and spaced from the first cathode by a n-well, and the anode of said second three pin diode structure is connected to the other power rail.

4. An ESD protection circuit for protecting an input to an internal circuit from ESD current pulses to an I/O contact, comprising,
    a bipolar junction transistor structure for shunting current to ground, wherein the bipolar junction transistor structure includes a first base contact connected to the I/O contact, and a second base contact connected to the input of the internal circuit, wherein the two base contacts are separated by a resistive element between the two base contacts.

5. An ESD protection circuit of claim 4, wherein the resistive element includes a base polysilicon region.

6. A method of protecting an input to an internal circuit against ESD current pulses to an I/O contact, comprising
    shunting the current pulse to ground by means of a bipolar junction transistor structure wherein the bipolar junction transistor structure includes a first base contact and a second base contact, and wherein the method includes connecting the first base contact to the I/O contact and the second base contact to the input of the internal circuit, and providing a resistive current path between the first base contact and the second base contact.

7. A method of claim 6, wherein the resistive current path comprises at least one internal resistive element of the bipolar junction transistor structure.

8. A method of claim 7, wherein the internal resistive element includes a base polysilicon region to which both base contacts are connected.

* * * * *